United States Patent [19]
Bower et al.

[11] Patent Number: 5,518,592
[45] Date of Patent: May 21, 1996

[54] SEAL CARTRIDGE FOR A ROTATABLE MAGNETRON

[75] Inventors: John H. Bower, Livermore; Henry A. Byorum, Monte Serano; Ronald E. Rambeau, Vacaville, all of Calif.

[73] Assignee: The BOC Group, Inc., Murray Hill, N.J.

[21] Appl. No.: 296,360

[22] Filed: Aug. 25, 1994

[51] Int. Cl.$^6$ ............................................. C23C 14/35
[52] U.S. Cl. ............................ 204/192.12; 204/298.21; 204/298.22; 204/298.23; 204/298.09; 204/298.28
[58] Field of Search .................. 204/298.12, 298.21, 204/298.22, 298.23, 298.28, 298.09, 192.12

[56] References Cited

U.S. PATENT DOCUMENTS

| | | | |
|---|---|---|---|
| 4,445,997 | 5/1984 | McKelvey | 204/298.23 |
| 4,446,877 | 8/1984 | McKelvey | 204/298.23 |
| 5,096,562 | 3/1992 | Boozenny et al. | 204/298.22 |
| 5,100,527 | 3/1992 | Stevenson et al. | 204/298.22 |
| 5,200,049 | 4/1993 | Stevenson et al. | 204/298.22 |

*Primary Examiner*—Nam Nguyen
*Assistant Examiner*—Rodney G. McDonald
*Attorney, Agent, or Firm*—David A. Draegert; David M. Rosenblum

[57] ABSTRACT

In a rotatable magnetron, a seal cartridge having vacuum seals integrated therein provides a seal between a seal housing of the magnetron support assembly and a spindle carried therein. The seal cartridge is axially movable with respect to the magnetron support assembly which enables its efficient removal and replacement therefrom. As such removal and replacement of the cartridge automatically accomplishes the removal and replacement of the integral vacuum seals, no handling or reassembly of the vacuum seals is required. The seal cartridge of the present invention provides a protected seal design which improves seal integrity in rotatable magnetrons.

11 Claims, 2 Drawing Sheets

5,518,592

SEAL CARTRIDGE FOR A ROTATABLE MAGNETRON

BACKGROUND OF THE INVENTION

The present invention is related generally to a magnetron apparatus for coating substrate articles by sputtering, and more particularly, to the seals used therein. The present invention is related specifically to a seal cartridge for use in a rotatable magnetron apparatus and a method of using same.

The coating of large area substrates, such as architectural glass, automobile windshields and the like, has been accomplished by a sputtering process that includes the use of a planar magnetron. Such coatings include multilayer solar control coatings that are widely used on commercial building windows. Because of the large surface area of the glass to be coated, the coating machinery is very large in scale.

More recently, a rotatable magnetron apparatus has been developed for such coating applications to overcome some of the problems known to inhere in the planar magnetron. A rotatable magnetron is described in U.S. Pat. No. 5,096,562, issued to Alex Boozenny and Josef T. Hoog on Mar. 17, 1992, the entire disclosure of which is incorporated herein by this reference.

Operation of the rotatable or rotating magnetron generally includes the rotation of a substantially cylindrical sputtering target in high vacuum about a stationary magnetic array, while providing appropriate fluid cooling. Thus, the rotating magnetron generally requires a rotational drive mechanism, bearings to permit target rotation about the magnetic array, and electrical and cooling conduits.

Because such rotational drive mechanism and conduits extend from an ambient environment into the vacuum chamber, the rotating magnetron further requires the use of vacuum seals around the rotational drive mechanism and the electrical and cooling conduits. While vacuum and rotary water seals have been used for this purpose, such seals have a tendency to develop leaks under conditions of high temperature and high mechanical loading.

In previous rotating magnetrons, such seals and bearings are placed directly between a seal housing and a rotatable target spindle to effect a dynamic seal. Thus, an inner surface of the seal housing and an outer surface of the spindle comprise the seal surfaces, or the wear surfaces, of the dynamic seal. Consequently, the seal configuration of previous rotating magnetrons exposes the seal housing and spindle to significant wear and thus, necessitates the time-consuming and costly removal and replacement of worn seal housings and spindles.

Further, in the previous rotating magnetrons, the removal and replacement of the target structure involves the removal, handling and replacement of the critical vacuum seals. While such handling exposes the seals to moisture and contaminants, the replacement of the seals further presents the opportunity for improper reassembly. Thus, the reassembly of these rotating magnetrons puts seal integrity, a critical aspect of effective sputtering, in question.

Additionally, the removal and replacement of the target structure in these rotating magnetrons is complicated and requires several hours. Such inefficient removal and replacement procedures result in large labor and production costs for less than optimum product throughput. Further, during such prolonged removal and replacement periods, the coating chamber is exposed to the ambient environment and thus, to moisture and contaminants. Such exposure adversely effects both product quality and yield. Thus, in the reassembly of these rotating magnetrons, unnecessary production costs are incurred, significant production time is lost, and product quality and yield are compromised.

Accordingly, it is an object of the present invention to provide a protected seal design to improve seal integrity in the rotatable magnetron.

It is another object of the present invention to provide a seal cartridge which includes seals and seal surfaces therein for use in a rotatable magnetron.

It is a yet another object of the present invention to provide a seal cartridge which facilitates the efficient removal and replacement of seals and seal surfaces of a rotatable magnetron.

Additionally, it is an object of the present invention to provide a method for the efficient removal and replacement of seals and seal surfaces of a rotatable magnetron.

SUMMARY OF THE INVENTION

The present invention improves upon the rotatable magnetron by providing a pre-fabricated unitary seal cartridge for providing a protected vacuum seal between the vacuum chamber and the ambient environment. Particularly, the seal cartridge is designed to provide a vacuum seal which is static, rather than dynamic, with respect to the seal housing and the rotatable target spindle of the rotatable magnetron. The seal cartridge is further designed to house an internal vacuum seal which is dynamic with respect to the interior surfaces of the seal cartridge. In this manner, the seal cartridge houses the wear surfaces of the protected dynamic seal while providing a static seal between the seal housing and the rotatable target spindle.

Therefore, the unitary seal cartridge of the present invention generally comprises an outer shell which contacts the seal housing and an inner shell which contacts the rotatable target spindle of the rotatable magnetron apparatus. In preparation for coating, the outer and inner shells are rotationally fixed with respect to the seal housing and the target spindle, respectively. The unitary seal cartridge further comprises an annular space between the inner and outer shells in which internal vacuum seals and bearings are housed. As the seal cartridge carries the vacuum seals internally, the interior surfaces of the seal cartridge shells comprise the wear surfaces of the vacuum seal, rather than surfaces of the seal housing and the target spindle. Thus, the unitary seal cartridge of the present invention protects the seal housing and target spindle from wear and increases their longevity in the rotatable magnetron.

In addition to preserving expensive components of the rotatable magnetron, the unitary seal cartridge protects the internal seals from moisture and contaminants and eliminates individual assembly of these vacuum seals. Thus, the seal cartridge provides a protected seal design which improves seal integrity in the rotatable magnetron.

In the present invention, the seal cartridge is further designed to be axially movable with respect to the seal housing of the rotatable magnetron. Thus, when the internal vacuum seals or the internal wear surfaces of the seal cartridge become too worn for further use, the seal cartridge is simply removed from the seal housing and replaced with a new pre-fabricated seal cartridge having fresh internal vacuum seals and seal surfaces. In this manner, the seal cartridge facilitates the efficient removal and replacement of vacuum seals and seal surfaces of the rotatable magnetron. Particularly, the seal cartridges of the present invention provide for the quick removal and replacement of the seals of the rotatable magnetron by reducing the time required to accomplish this task from several hours in existing rotatable magnetrons to approximately five minutes or less in the improved rotatable magnetron.

In brief, the seal cartridge of the present invention provides a pre-assembled sealed unit in which the inner and outer seal surfaces, the seals, the seal lubricants and the seal bearings are contained. The pre-assembled unit is simply placed into the seal housing to await placement of the target spindle therein. Thus, there are no exposed seals which are subject to improper assembly. Further, as the preassembled unit is pre-sealed, there is no need to keep the assembly area scrupulously clean during target tube changes or routine service. Upon exhaustion of the seal cartridge, the spindle is simply slipped out from the seal cartridge interior and the cartridge is similarly slipped out of the seal housing to be replaced by a fresh pre-assembled seal cartridge unit.

Additional objects, advantages and features of the various aspects of the present invention will become apparent from the following detailed description of the preferred embodiments, which description should be taken in conjunction with the accompanying drawings.

DESCRIPTION OF A PREFERRED EMBODIMENT

Figure 1:
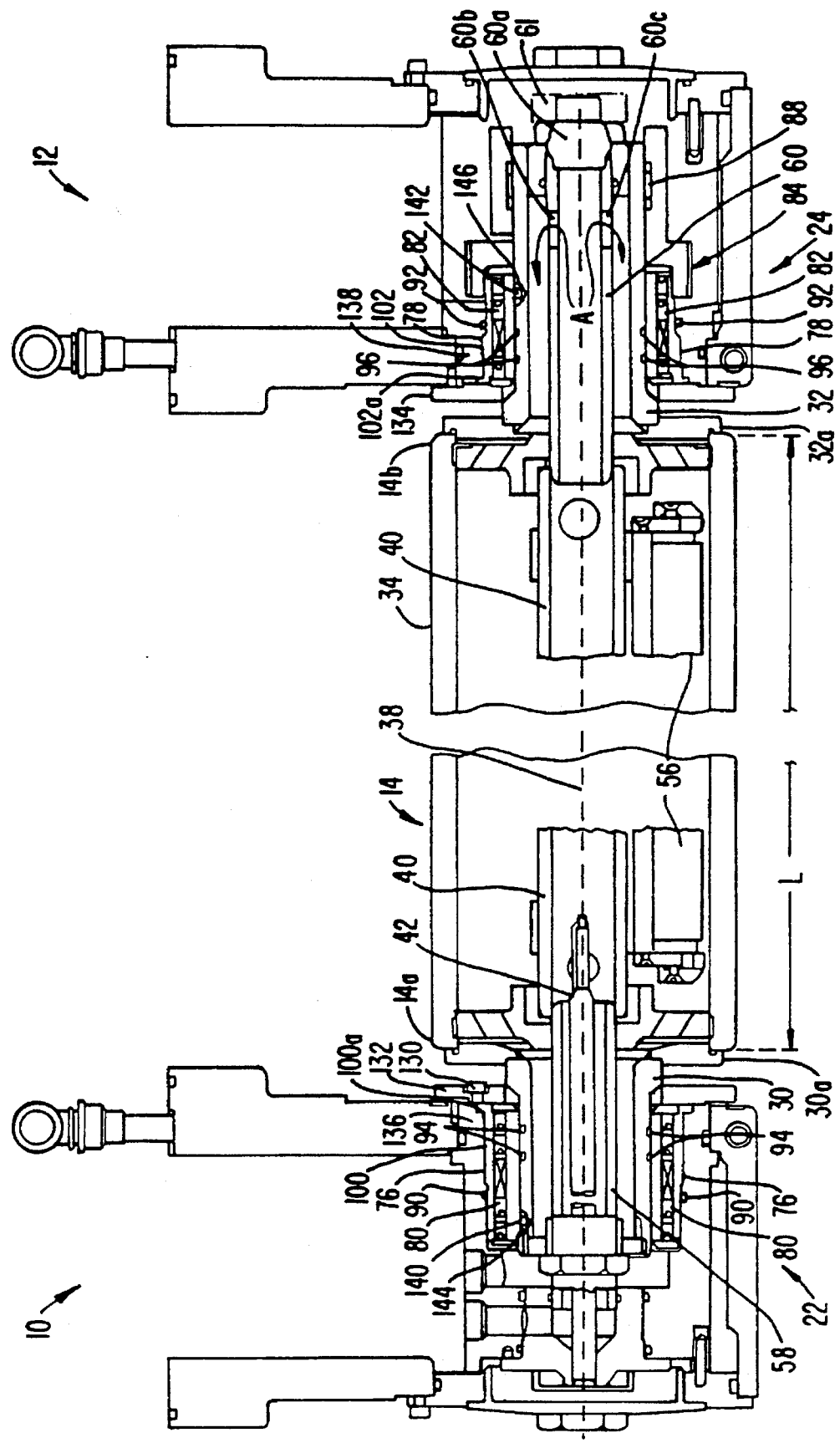
FIG. 1 is a longitudinal cross-sectional view of a rotatable magnetron having seal cartridges therein, according to the present invention.

The seal cartridge of the present invention is used primarily in a rotatable magnetron apparatus, such as that shown in FIG. 1. Preferably, the seal cartridge is used in a rotatable magnetron which is described in a United States patent application (Ser. No. 08/296,237, entitled "Rotatable Magnetron Including a Replaceable Target Structure" and filed concurrently herewith by inventor John H. Bower, the entire disclosure of which is incorporated herein by this reference.

The rotatable magnetron apparatus including the seal cartridge will now be described in reference to FIG. 1. Particularly, the apparatus is shown to include an end 10, an opposite end 12, and a cylindrical target 14 disposed between ends 10 and 12. The cylindrical target 14 has first and second target ends 14a and 14b, which define a target length L therebetween. For convenience, the cylindrical target 14 is shown in abbreviated form because it is typically quite lengthy with respect to the ends 10 and 12 of the rotatable magnetron.

On an outside surface of the cylindrical target 14, a sputtering target surface 34 is formed. During coating, the cylindrical target 14 is rotated about a central longitudinal axis 38 so that the target surface 34 is rotated through a magnetic sputtering zone. This magnetic sputtering zone is created by a magnetic array 56 which is positioned within the target 14. The magnetic array 56 is generally supported by a magnet support structure 40 which may be rotationally fixed with respect to its supportive structures 22 and 24 (below) via an axially movable fixing structure 42.

As shown in FIG. 1, the rotatable magnetron further includes first and second spindles 30 and 32 which support for the cylindrical target 14 and provide for its rotation. Particularly, first and second spindles 30 and 32 include structures 30a and 32a, respectively, for engaging the first and second ends 14a and 14b, respectively, of the cylindrical target 14.

As is further shown in FIG. 1, the first and second spindles 30 and 32 are carried by first and second support structures 22 and 24. Preferably, the first and second spindles 30 and 32 are axially movable with respect to the first and second support structures 22 and 24, such that they can be easily retracted therein to disengage the target ends 14a and 14b, respectively, during normal target tube changes. Such removal of the target 14 and axial movement of the spindles 30 and 32 relative to the first and second support structures 22 and 24 are described in the above-mentioned United States patent application (Ser. No. 08/296,237 of John H. Bower, which is incorporated herein by reference. For example, the axial movement of the first and second spindles may be facilitated by spindle positioning structures 58 and 60, which are also axially movable with respect to the first and second support structures 22 and 24. Once the target tube 14 has been removed from the magnetron apparatus, these axially movable spindles 30 and 32 can be extended and removed from the first and second support structures 22 and 24, respectively, so that the seal cartridges 80 and 82 can be similarly removed during seal cartridge replacement.

In addition to supporting the first spindle 30, the first support structure 22 generally provides conduits (not shown) for supplying cooling fluid to and withdrawing cooling fluid from the target structure 14 at the end 10 of the rotatable magnetron. Thus, at end 10, the spindle positioning structure 58 is hollow along substantially its entire length to accommodate the passage of cooling fluid therethrough.

At the opposite end 12, the second support structure 24 generally provides power devices for rotating the target structure 14 including a drive source (not shown), a pulley 84 and pulley bearings (not shown). Generally, the second support structure 24 additionally provides electrical devices for electrically energizing the sputtering surface 34 of target structure 14 including an electrical conductor (not shown) and an electrical contact device 88.

As cooling fluid is not ordinarily supplied at this opposite end 12 of the rotatable magnetron, the spindle positioning structure 60 need not be hollow along substantially its entire length; rather, it may be solid at its end 60a and lie adjacent a thrust bearing 61. Thus, cooling fluid flowing through a hollow portion of the spindle positioning structure 60 flows out of apertures 60b and 60c into a channel between an exterior of the spindle positioning structure 60 and an interior of the second spindle 32, as indicated by the arrows A shown in FIG. 1.

While the cooling conduits and the rotational drive and electrical energizing devices have been described above with respect to the first and second support structures 22 and 24, respectively, it is understood that these conduits and devices may be provided by either one of the support structures 22 and 24. Preferably, the above-described axially movable components of the rotatable magnetron are so movable irrespective of any such conduits or devices provided by the first and second support structures 22 and 24.

The provision of cooling conduits, rotational drive devices and energizing devices is described in the above-mentioned United States patent application (Ser. No. 08/296,237 of John H. Bower and U.S. Pat. No. 5,096,562, which are incorporated herein by reference. As described above, it is the provision of such conduits and devices which extend from an ambient environment to the vacuum chamber that calls for the further provision of fluid and pressure seals.

Thus, in addition to providing such conduits and devices, the first and second support structures 22 and 24 provide seal bearing surfaces 76 and 78, respectively. These bearing surfaces 76 and 78 surround the outside surfaces of the seal cartridges 80 and 82, respectively. As generally shown in FIG. 1, gland seals 90 and 92, typically o-ring seals, may be placed between the bearing surfaces 76 and 78 and exterior surfaces of the seal cartridges 80 and 82, respectively, to further prevent fluid or pressure leaks and contaminant introduction therebetween. These static seals 90 and 92 are recessed in grooves adjacent the bearing surfaces 76 and 78 so that they are unlikely to be damaged or inadvertently dislodged. Similarly, as is generally shown in FIG. 1, static gland seals 94 and 96 may be protectively recessed in grooves adjacent the surfaces of the rotating target spindles 30 and 32 to further prevent leaks and contaminant introduction between these surfaces and the interior surfaces of the seal cartridges 80 and 82.

The seal cartridges 80 and 82 will now be described in reference to FIGS. 2A and 2B, respectively, in which they are shown independently of the rotatable magnetron apparatus. The seal cartridges 80 and 82 are shown to include outer shells 100 and 102, inner shells 104 and 106, and annular spaces 108 and 110 therebetween, respectively. Disposed within these annular spaces 108 and 110 are seals 112 and 114, seal spacers 116 and 118, and bearings 120 and 122. These interior components are retained within their respective annular spaces 108 and 110 by thrust washers 124 and 126 and retainer washers 128 and 130, respectively.

Figure 2A:
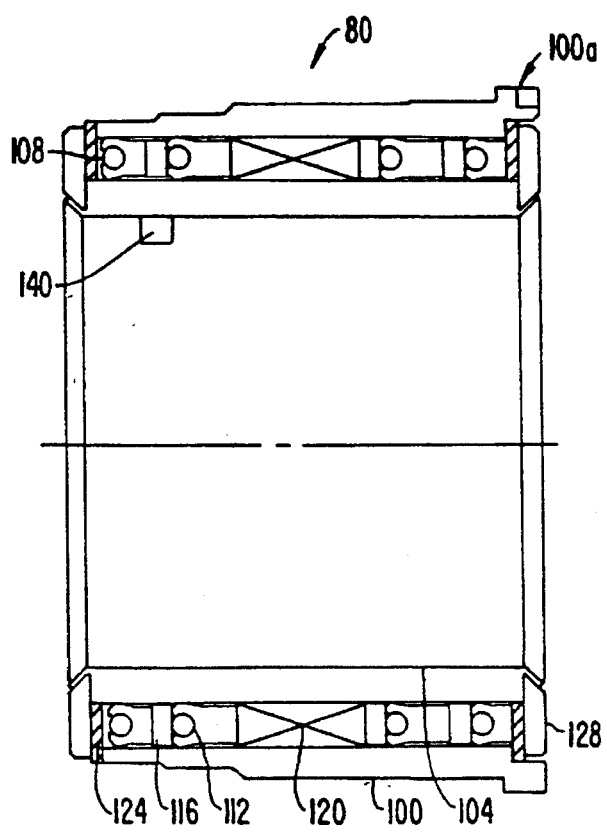
FIG. 2A is a longitudinal cross-sectional view of a cartridge seal for use in an end of the rotatable magnetron shown in FIG. 1, according to the present invention.
Figure 2B:
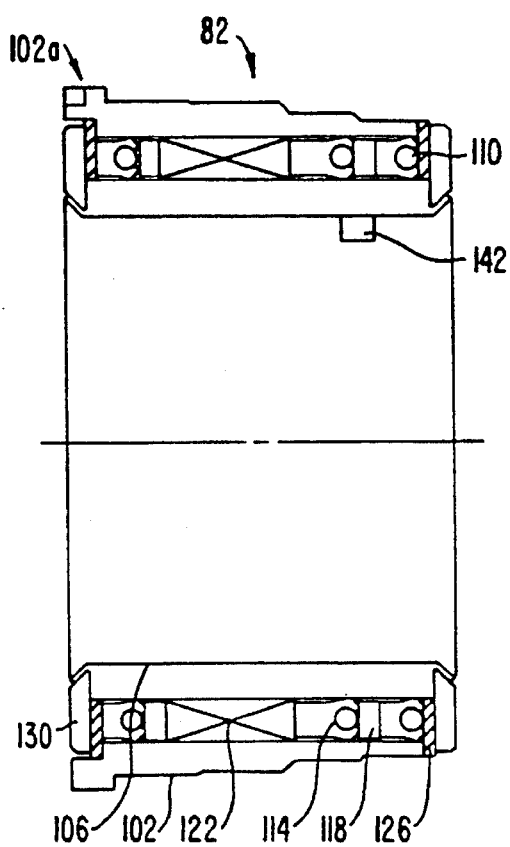
FIG. 2B is a longitudinal cross-sectional view of a cartridge seal for use an opposite end of the rotatable magnetron shown in FIG. 1, according to the present invention.

It is understood that the above-mentioned reference numerals also refer to duplicates of the referenced interior components that are shown in FIGS. 2A and 2B. By way of example, seal cartridges 80 and 82 may require multiple internal seals in various arrangements to provide an adequate seal. As exemplified in FIGS. 1 and 2A, within the first support structure 22 which is generally associated with the provision of cooling fluid (above), seal cartridge 80 may require multiple seals 112 on either side of the bearing 120. At the opposite end 12, within the second support structure 24 of FIG. 1 which is generally free of fluids (above), seal cartridge 82 of FIG. 2B may require fewer seals 114 surrounding the bearing 122. The number and arrangement of the seals 112 and 114 will generally depend on the operating conditions (i.e., ambient air and fluid pressure, and chamber pressure) of the rotatable magnetron.

As shown in FIGS. 2A and 2B, the internal seals 112 and 114 are preferably rotary seals in the form of a ring of elastomeric material in a cross-sectional "U" shape which is filled with vacuum grease. Additionally, the bearings 120 and 122 are preferably roller bearings which distribute the force acting upon them and thereby, reduce wear on the seal surfaces of seal cartridges 80 and 82. The combination of such seals 112 and 114 and bearings 120 and 122 within the seal cartridges 80 and 82, respectively, provides effective isolation between the ambient environment and the vacuum chamber while allowing the target spindles 30 and 32 to rotate freely within the seal cartridges 80 and 82. This rotation of the target spindles 30 and 32 within the seal cartridges 80 and 82 is facilitated by the configuration of the seal cartridges upon assembly, which is described below.

In the assembly of the rotatable magnetron in preparation for coating, the seal cartridges 80 and 82 are placed in the first support structures 22 and 24, respectively. The outer shells 100 and 102 are then rotationally fixed with respect to the bearing surfaces 76 and 78, respectively. By way of example in FIG. 1, a flange 100a on the outer shell 100 of seal cartridge 80 is shown to be so fixed by a bolt 130. The bolt 130 also serves to mount the end shield 132 and to prevent rotation of the seal housing 136 which provides the bearing surface 76. It is understood that at the opposite end 12 of the rotatable magnetron apparatus, a similar flange 102a of outer shell 102 is capable of being so fixed by such a bolt (not shown) used to mount the end shield 134 and to prevent rotation of the seal housing 138 which provides the bearing surface 78.

Additionally, in the assembly of the rotatable magnetron, the inner shells 104 and 106 are rotationally fixed with respect to the rotatable target spindles 30 and 32, respectively. By way of example in FIGS. 2A and 2B, inner shells 104 and 106 carry pins 140 and 142, respectively, for engaging the spindles 30 and 32. Particularly, as shown in FIG. 1, pins 140 and 142 fit key-ways 144 and 146 of spindles 30 and 32 to rotationally fix the inner shells 104 and 106 with respect to the spindles 30 and 32.

Thus, once the rotatable magnetron is fully assembled in the above-described manner and is put into operation, static seals are formed between the outer shells 100 and 102 and the bearing surfaces 76 and 78, respectively, and between the inner shells 104 and 106 and the spindles 30 and 32, respectively. Such static seals may be effected by the recessed gland seals 90, 92, 94 and 96 described herein. While the outer shells 100 and 102 remain rotationally stationary within seal housings 136 and 138 and the inner shells 104 and 106 rotate along with the rotating target spindles 30 and 32, a dynamic seal is formed between these outer and inner shells by way of the internal seals 112 and 114 and bearings 120 and 122 within the annular space 108 and 110 of the seal cartridges 80 and 82. In this manner, the seal cartridges 80 and 82 provide effective seals between the vacuum chamber of the rotatable magnetron and an ambient environment, while protecting such seals from contamination and wear and preserving the bearing surfaces 76 and 78 of the seal housings 136 and 138 and the outer surfaces of the target spindles 30 and 32. Further, these axially movable seal cartridges 80 and 82 facilitate the efficient removal and replacement of the seals and seal surfaces contained therein. Particularly, when the seal cartridges 80 and 82 are employed in the rotatable magnetron, the time required to remove and replace these seal cartridges with fresh pre-assembled seal cartridge units is on the order of five minutes or less.

It is to be understood that while the invention has been described above with respect to a specific preferred embodiment, the description is intended to illustrate and not to limit the scope of the invention, which is defined by the scope of the appended claims.

It is claimed:

1. A rotatable magnetron apparatus comprising:

a cylindrical target having first and second target ends and being rotatable about a longitudinal axis thereof;

at least one support structure for carrying therein a spindle, said one support structure having a bearing surface therein;

said spindle being capable of engaging one of said first and second target ends and having an annular outer surface along a portion thereof; and a unitary seal cartridge having outer and inner shells, an annular space therebetween, and a bearing and at least one vacuum seal disposed within the annular space, said outer shell disposed adjacent the bearing surface of said support structure and rotationally fixed with respect thereto, said inner shell surrounding the annular outer surface of said spindle and rotationally fixed with respect thereto.

2. The rotatable magnetron according to claim 1 in which said spindle is axially movable with respect to said unitary seal cartridge to engage said one target end when sufficiently extended outwardly with respect to said unitary seal cartridge and to disengage from said one target end when sufficiently retracted inwardly with respect to said cartridge.

3. The rotatable magnetron according to claim 1 or claim 2, in which said unitary seal cartridge is axially movable with respect to said support structure.

4. The rotatable magnetron according to claim 3 in which said spindle and said unitary seal cartridge are axially movable with respect to said support structure to be removable therefrom.

5. The rotatable magnetron according to claim 1 in which said inner shell includes means for engaging said spindle to fix a rotational position of said inner shell with respect to said spindle.

6. The rotatable magnetron according to claim 1 in which the annular space has an end which is closer to the target tube than an opposite end thereof, at least one vacuum seal is disposed towards the end of the annular space, said bearing is disposed towards the opposite end of the annular space, and at least another vacuum seal is disposed between said bearing and the opposite end of the annular space, said unitary seal cartridge providing a vacuum seal between the bearing surface and the annular outer surface.

7. The rotatable magnetron according to claim 6, further comprising means within said support structure for supplying fluid to and withdrawing fluid from an interior of the target, said seal cartridge providing a fluid seal between the bearing surface and the annular outer surface.

8. The rotatable magnetron according to claim 3, further comprising at least one seal disposed within said support structure, adjacent the bearing surface thereof and said outer shell.

9. The rotatable magnetron according to claim 3, further comprising at least one seal disposed within said spindle, adjacent the annular outer surface thereof and said inner shell.

10. A method of replacing seal means with replacement seal means in a magnetron of a type having: (1) a cylindrical target having first and second target ends and being rotatable about a longitudinal axis thereof; (2) at least one support structure for carrying therein a spindle, said support structure having a bearing surface therein; (3) said spindle being capable of engaging one of the first and second target ends and having an annular outer surface along a portion thereof; and (4) means disposed within the support structure for providing a seal between the bearing surface and the annular outer surface, said method comprising:

(a) providing seal means within a seal cartridge which is axially movable with respect to the support structure;

(b) removing the seal cartridge from the support structure; and (c) replacing the seal cartridge with a replacement seal cartridge having replacement seal means therein.

11. The method according to claim 10, further comprising providing said spindle which is axially movable with respect to the support assembly and removable therefrom, and prior to removing the seal cartridge from the support structure, removing said spindle from the support assembly.

\* \* \* \* \*